(12) United States Patent
Matsuda et al.

(10) Patent No.: US 7,759,151 B2
(45) Date of Patent: Jul. 20, 2010

(54) SOLID STATE IMAGING APPARATUS, IMAGING APPARATUS AND SOLID STATE IMAGING APPARATUS MANUFACTURING METHOD

(75) Inventors: Jiro Matsuda, Miyagi (JP); Masanori Nagase, Miyagi (JP); Shu Takahashi, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 171 days.

(21) Appl. No.: 12/015,608

(22) Filed: Jan. 17, 2008

(65) Prior Publication Data

US 2008/0173902 A1    Jul. 24, 2008

(30) Foreign Application Priority Data

Jan. 24, 2007    (JP) .............................. 2007-013413

(51) Int. Cl.
*H01L 21/00* (2006.01)
(52) U.S. Cl. .......................... 438/48; 438/57; 438/479; 257/229; 257/E23.122; 257/E21.456

(58) Field of Classification Search .................. 257/232, 257/233, 249, 435, E27.151, E27.154
See application file for complete search history.

(56) References Cited

U.S. PATENT DOCUMENTS 6,133,595 A * 10/2000 Senda ......................... 257/232

FOREIGN PATENT DOCUMENTS

JP    7-153932 A    6/1995

* cited by examiner

*Primary Examiner*—Fernando L Toledo
*Assistant Examiner*—Mamadou Diallo
(74) *Attorney, Agent, or Firm*—Birch, Stewart, Kolasch & Birch, LLP

(57) ABSTRACT

A solid state imaging apparatus comprises: a semiconductor substrate; a photoelectric converting portion on the semiconductor substrate; a light shielding film in a region excluding a light receiving surface of the photoelectric converting portion; and a P-type impurity layer between a lower surface of the light shielding film and the semiconductor substrate.

6 Claims, 11 Drawing Sheets

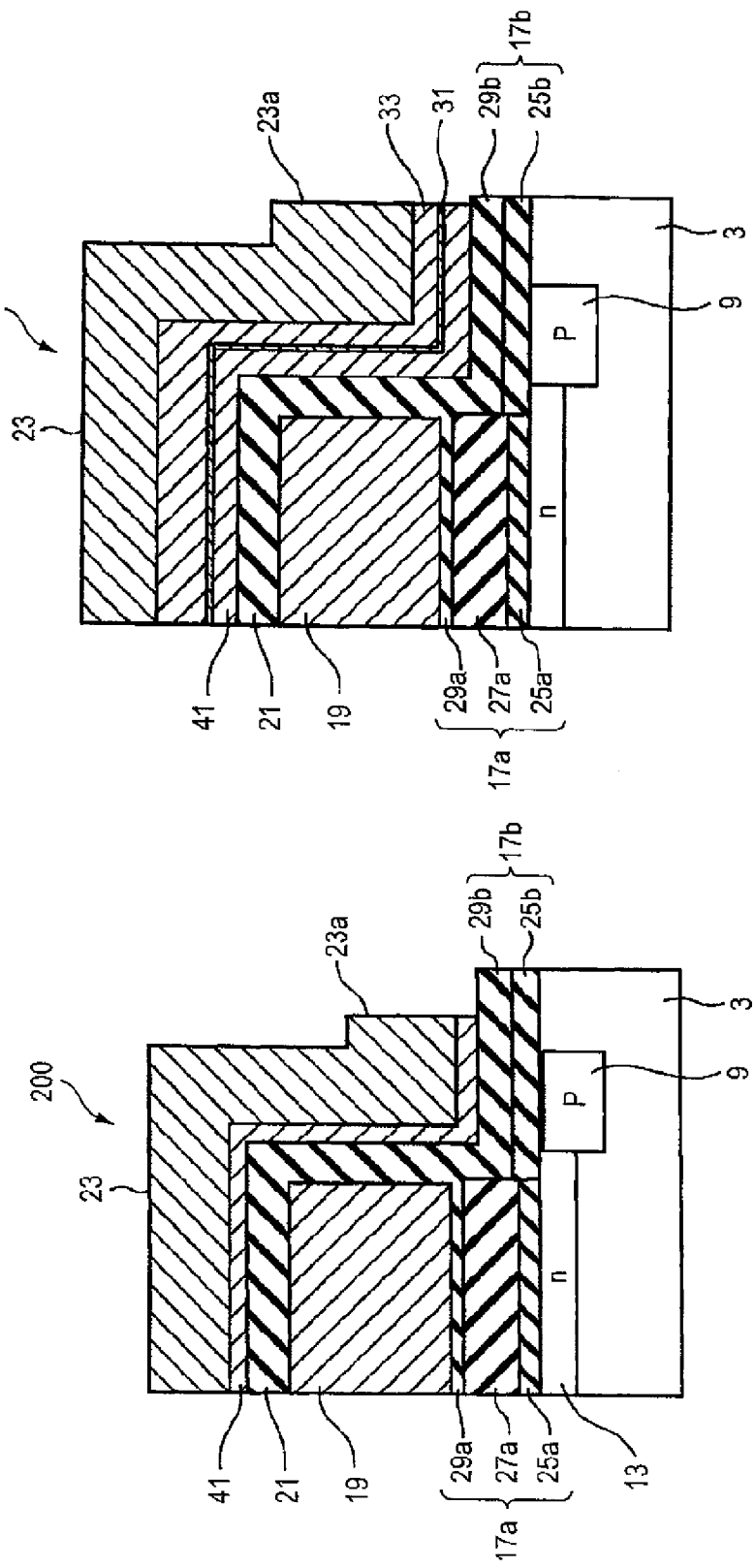

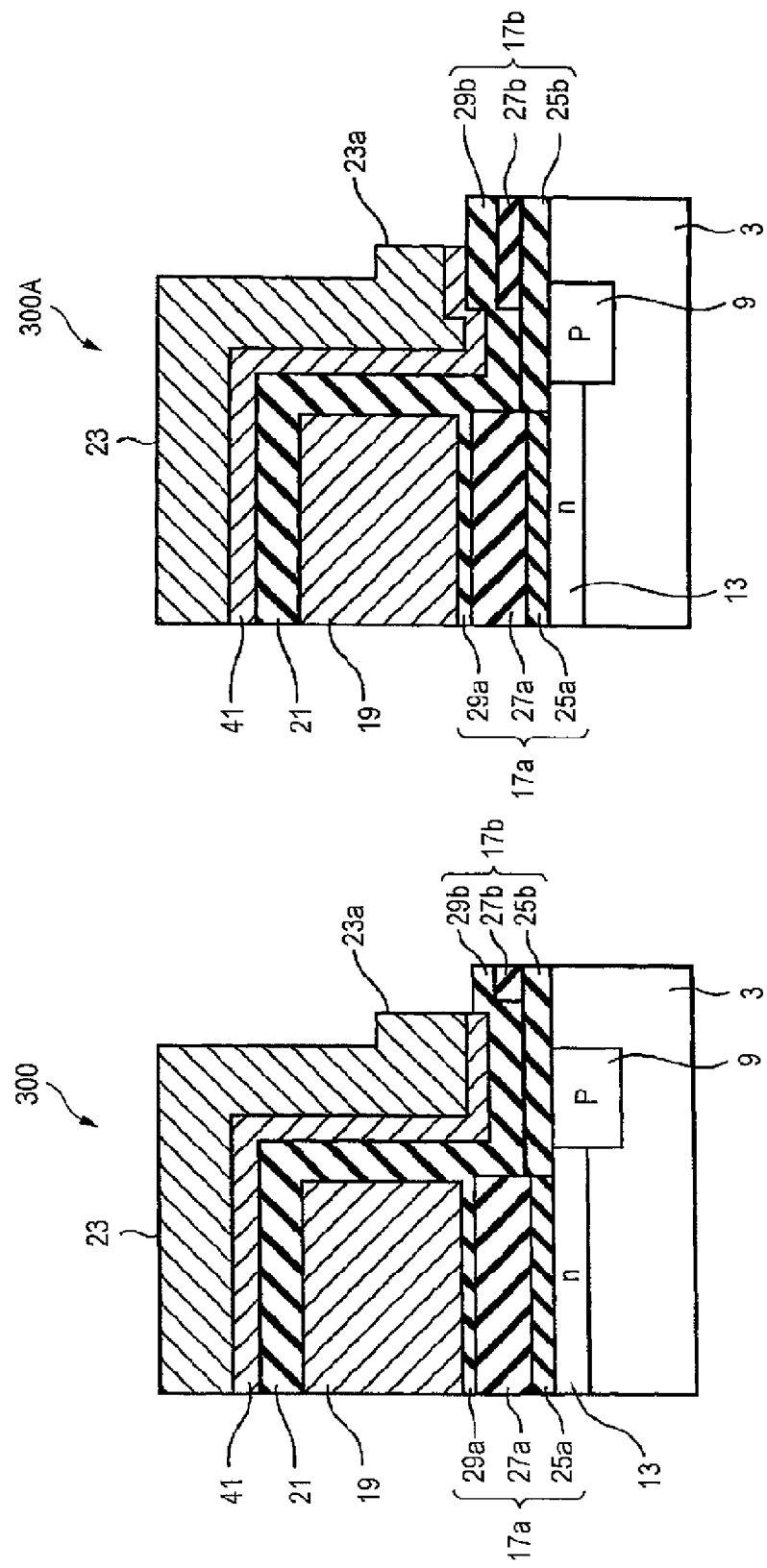

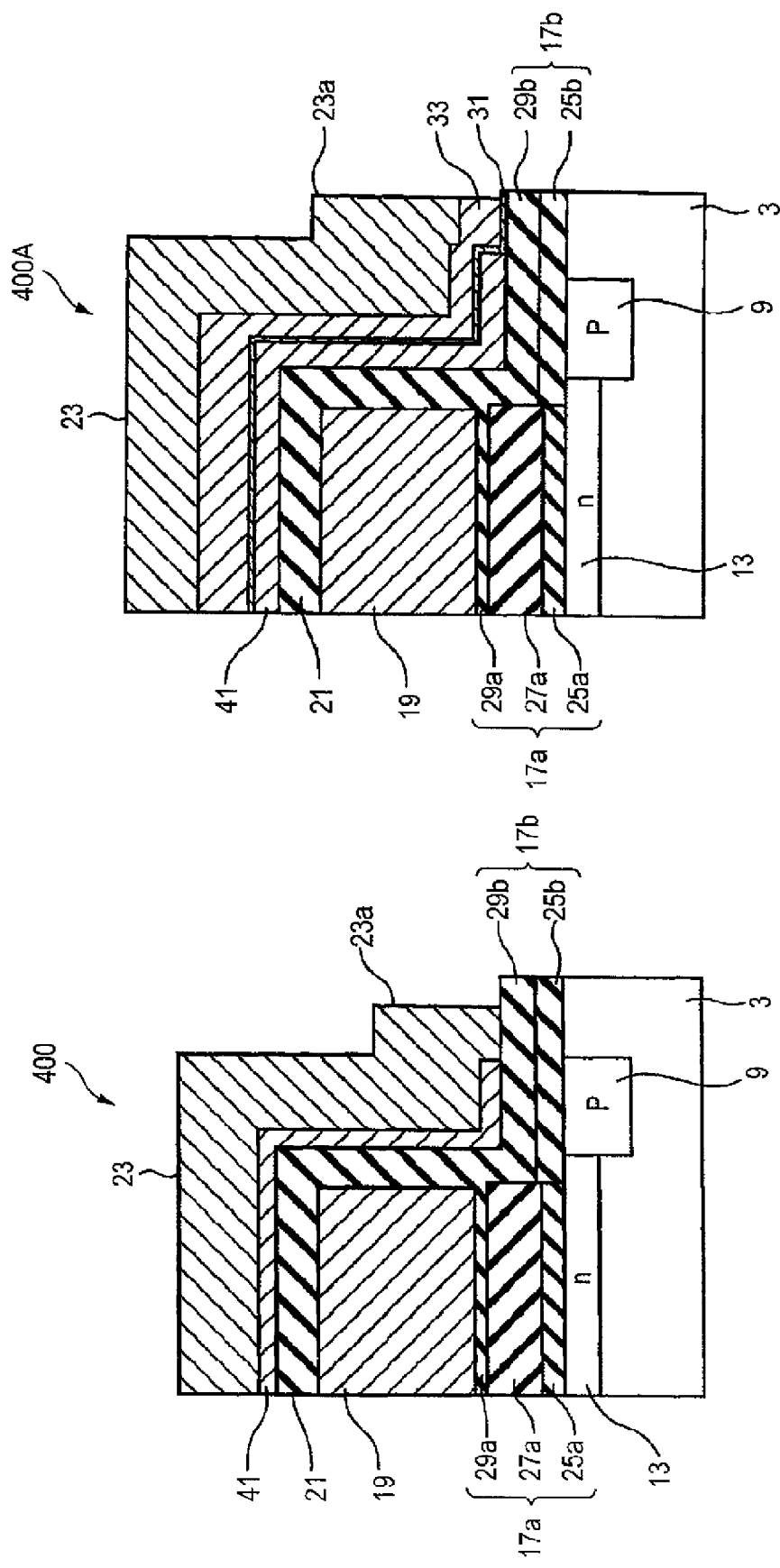

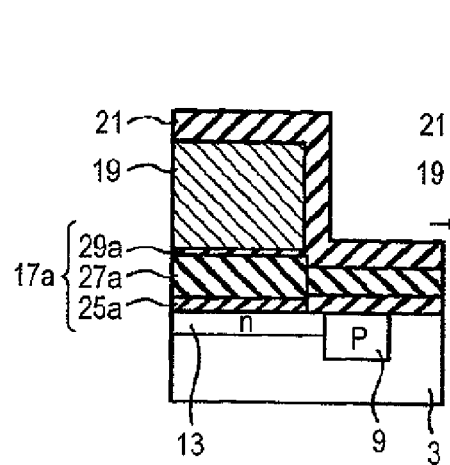
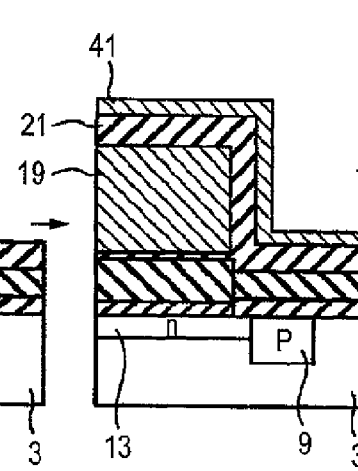
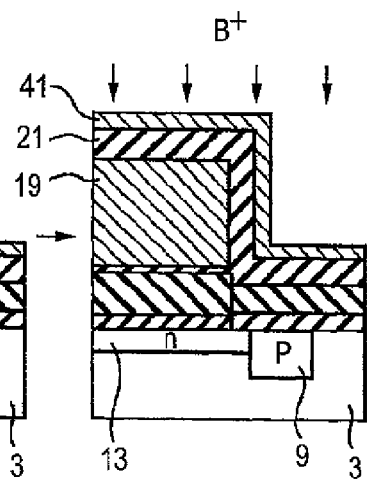
FIG. 8A  FIG. 8B  FIG. 8C
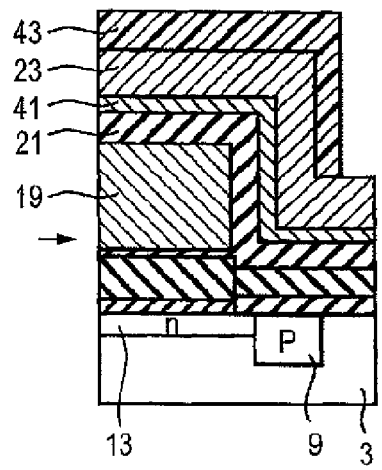
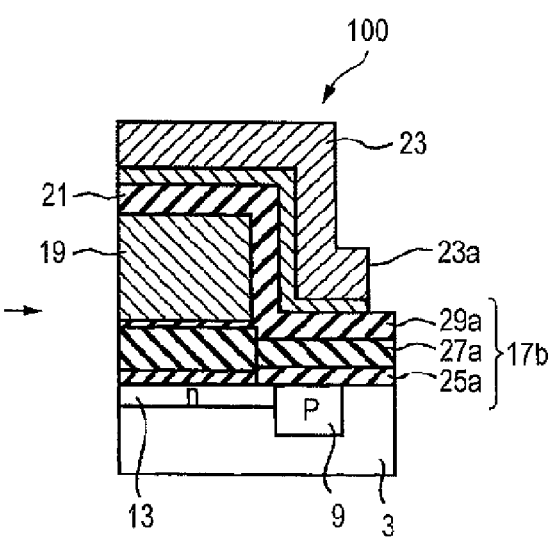
FIG. 8D  FIG. 8E FIG. 9A
FIG. 9B
FIG. 9C
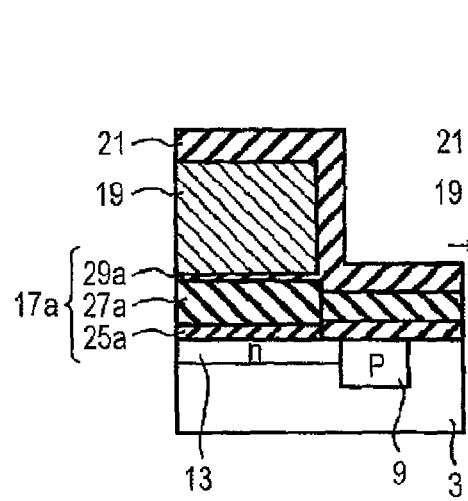
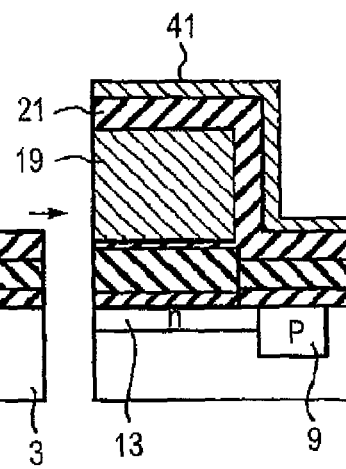
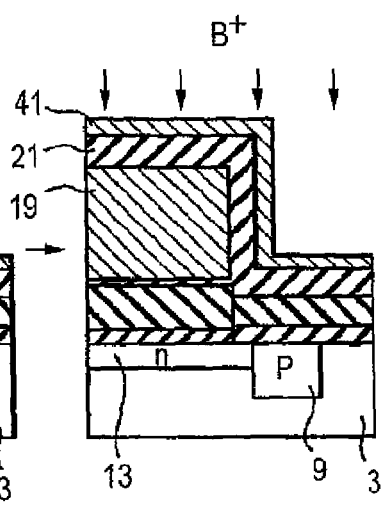
FIG. 9D
FIG. 9E
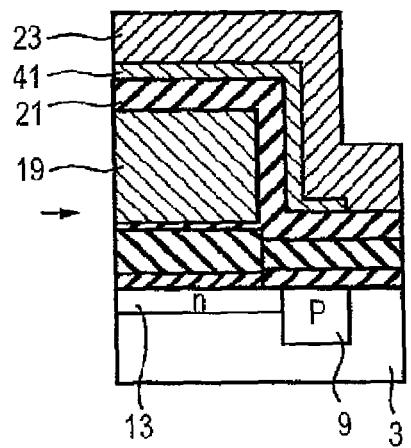
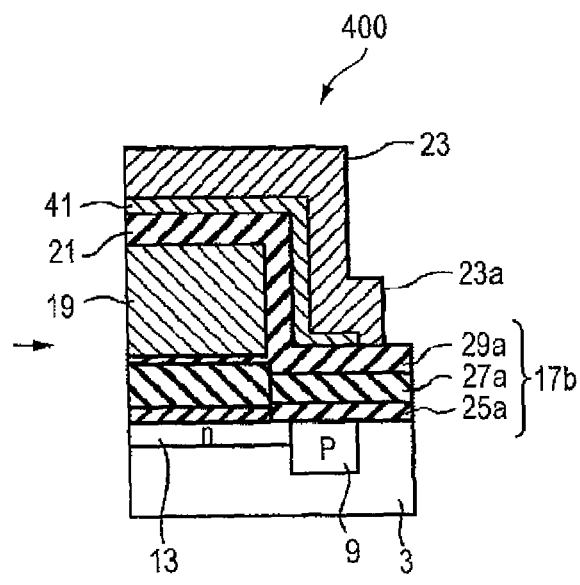

SOLID STATE IMAGING APPARATUS, IMAGING APPARATUS AND SOLID STATE IMAGING APPARATUS MANUFACTURING METHOD

BACKGROUND OF THE INVENTION

1. Field of the Invention

The present invention relates to a solid state imaging apparatus and an imaging apparatus, and a method of manufacturing the solid state imaging apparatus, and more particularly to an improved technique for easily enabling a negative potential to be applied to a lower part of a light shielding film, thereby suppressing a smear current.

2. Description of the Related Art

For example, a solid state imaging device to be used in a digital camera, particularly, a conventional solid state imaging device using CCD (Charge Coupled Devices) will be described with reference to FIGS. 11, 12A and 12B. FIG. 11 is a typical view showing a section corresponding to approximately one pixel of the solid state imaging device and FIGS. 12A and 12B are enlarged sectional views showing the vicinity of a device isolating region in FIG. 11, FIG. 12A illustrating a light shielding film of only W and FIG. 12B illustrating a lamination structure in which Ti/TiN films are additionally provided under the light shielding film of W.

A p-type semiconductor layer 5 is formed on an N-type semiconductor substrate 3 of a solid state imaging device 1, and an N-type region portion 7 is provided in a surface part of the p-type semiconductor layer 5. Consequently, a photodiode 7 to be a photoelectric converting portion for carrying out a photoelectric conversion together with the p-type semiconductor layer 5 (the N-type region portion 7 will be hereinafter referred to as the photodiode) is formed. A device isolating region (p region) 9 is provided on an adjacent pixel side of the N-type region portion 7 and an N region (a vertical charge transfer path) 13 is provided on an opposite side through a reading gate portion 11. The N region 13 constitutes an embedded channel of the vertical transfer path in the solid state imaging device 1.

A high concentration impurity surface layer 15 of a reverse conductive type (a p type) is provided in a surface part of the N-type region portion 7. Since the high concentration impurity surface layer 15 is provided, a free electron generated as a dark current is caught by a hole of the high concentration impurity surface Layer 15 so that a dark current component can be prevented from appearing as a scratch in an image. The high concentration impurity surface layer 15 according to the embodiment is provided by a division into a central high concentration portion (a $p^+$ region) 15a on the surface of the N-type region portion 7 and a low concentration portion (a $p^-$ region) 15b in a peripheral part thereof. By setting the periphery to be the low concentration portion 15b, it is possible to reduce an electric field in the peripheral part, thereby dropping a voltage at which a charge stored in the photodiode (the N-type region portion) 7 is read onto the embedded channel 13 of the vertical transfer path.

An uppermost surface of the semiconductor substrate 3 in which the photodiode 7 and the embedded channel 13 are formed is covered with an insulating layer 17. A vertical transfer electrode film (for example, a polysilicon film) 19 is provided on the insulating layer 17 just above the embedded channel 13. A light shielding film 23 formed by a metal film is provided on the vertical transfer electrode film 19 through an insulating layer 21. An opening 23a is provided on the light shielding film 23 just above each photodiode 7, and a light is incident into the N-type region portion 7 via the opening 23a.

The insulating layer 17 is constituted by an insulating layer 17a provided under the vertical transfer electrode film 19 and an insulating layer 17b provided under the light shielding film 23, and forms an ONO structure including oxide films ($SiO_2$) 25a and 25b, nitride films (SiN) 27a and 27b, and oxide films ($SiO_2$) 29a and 29b shown in FIG. 12A. As shown in FIG. 12B, moreover, titanium (Ti) 31 and titanium nitride (TiN) 33 may be provided between the light shielding film 23 and the oxide film 29b. The Ti/TiN films are provided in order to prevent the light shielding film 23 from being peeled.

In the solid state imaging apparatus 1 constituted as described above, it is necessary to suppress the generation of a smear to be a peculiar noise. The smear appears as a longitudinal line when a part in a light receiving surface is exposed to a strong incident light and a generated signal charge overflows from a pixel and enters the charge transfer portion. Also in the case in which a signal charge generated in a deep part of the substrate enters the charge transfer portion, moreover, the smear is caused.

W (tungsten) or W/TiN/Ti to be the light shielding film 23 of the CCD is usually connected to GND. From the past investigation, it has been found that a carrier diffused over a surface P layer mainly causes a smear in the recent CCD which is sufficiently shielded and a change is made depending on a difference in a potential of the surface Player. It is desirable that the potential applied to a surface should be reduced as greatly as possible when the smear is to be improved. As a proposal, a negative potential is applied to the light shielding film which is currently connected to the GND.

For example, a solid state imaging apparatus disclosed in JP-A-7-153932 comprises potential applying means for applying a predetermined potential to a light shielding film. By the application of the predetermined potential to the light shielding film coming in contact with a substrate, a potential of a sensor interface is set to be equal to or lower than a quasi Fermi level in a sensor surface region, thereby suppressing the generation of a false signal. By an application of a lower potential than a surface potential of a sensor portion in a receipt of a light through the sensor portion, moreover, a minority carrier generated by a photoelectric conversion is discharged to the light shielding film to reduce a recombination probability of an electron and a hole.

However, the light shielding film is usually connected to the GND. In order to apply a negative potential other than the GND, therefore, it is necessary to take a terminal out, and to change the applied potential into a pulse and to apply the pulse. For this reason, there is a disadvantage that manufacturing steps are considerably increased and a productivity is thus reduced, resulting in an increase in a manufacturing cost. In case of a solid state imaging device to be used in an inexpensive household product, particularly, it is necessary to reduce a consumed power and to decrease the number of power supplies. Under the actual circumstances, therefore, a ground potential is to be applied as an intermediate potential to a gate electrode. Under present conditions, consequently, a negative bias cannot be applied as the intermediate potential and a potential barrier cannot be formed in an entrance of a vertical charge transfer portion in the conventional solid state imaging device.

SUMMARY OF THE INVENTION

In consideration of the circumstances, it is an object of the invention to provide a solid state imaging apparatus and an imaging apparatus in which a negative potential can easily be applied to a lower part of a light shielding film, and a method of manufacturing the solid state imaging apparatus, thereby suppressing a smear current.

The object according to the invention can be achieved by the following structure.

(1) A solid state imaging apparatus comprising: a semiconductor substrate; a photoelectric converting portion on the semiconductor substrate; a light shielding film in a region excluding a light receiving surface of the photoelectric converting portion; and a P-type impurity layer between a lower surface of the light shielding film and the semiconductor substrate.

According to the solid state imaging apparatus, the P-type impurity layer is provided so that an electric potential distribution between the photoelectric converting portion and a charge transfer path which is adjacent thereto is varied depending on a difference in a work function, for example. Consequently, an equivalent state to a state in which a negative potential is applied is brought. Thus, it is possible to increase a height of a potential barrier. In other words, it is possible to obtain the same result as that in the case in which a negative bias is effectively applied. Therefore, an electron generated on a surface of a light receiving portion can be prevented from flowing into the charge transfer path through the potential barrier, and the generation of a smear can be suppressed.

(2) The solid state imaging apparatus according to (1), further comprising a titanium nitride film provided between the light shielding film and the P-type impurity layer.

According to the solid state imaging apparatus, the titanium nitride film (TiN) is provided to cover the P-type impurity layer. Consequently, it is possible to prevent the light shielding film from being peeled.

(3) The solid state imaging apparatus according to (1) or (2), wherein a gate insulating film of a plurality of insulating layers is formed in a surface part of the semiconductor substrate, and the gate insulating film provided on a lower surface of the P-type impurity layer has a portion formed by removing any of the insulating layers.

According to the solid state imaging apparatus, the gate insulating film is formed in a small thickness over the lower surface of the P-type impurity layer. Consequently, it is possible to increase the height of the potential barrier more greatly, thereby enhancing the effect of suppressing a smear.

(4) The solid state imaging apparatus according to (3), wherein the insulating layers are formed by laminating a first silicon oxide film, a silicon nitride film and a second silicon oxide film, and the gate insulating film provided on the lower surface of the P-type impurity layer is formed by the insulating layer of the first and second silicon oxide films in which the silicon nitride film is removed.

According to the solid state imaging apparatus, the thickness of the insulating film provided under the P-type impurity layer is reduced as greatly as possible within a range of a dielectric voltage. By reducing the thickness of the film, it is possible to increase the height of the potential barrier more greatly, thereby extracting the effect of suppressing a smear more highly.

(5) The solid state imaging apparatus according to any of (1) to (4), wherein an end of the P-type impurity layer is covered with the light shielding film.

According to the solid state imaging apparatus, the P-type impurity layer for transmitting a light is completely covered with the light shielding film in portions other than a region to which a negative bias is to be applied. Therefore, it is possible to enhance the effect of suppressing a smear.

(6) The solid state imaging apparatus according to any of (1) to (5), further comprising a charge transfer portion formed in the surface part of the semiconductor substrate and a charge transfer electrode formed to face the charge transfer portion, the charge transfer electrode including a portion of the P-type impurity layer.

According to the solid state imaging apparatus, it is possible to enhance the effect of blocking a leakage, as a diffusion current, of a carrier generated by the photoelectric converting portion in each pixel position to other adjacent charge transfer portions. Thus, it is possible to enhance the effect of suppressing a smear.

(7) An imaging apparatus comprising the solid state imaging apparatus according to any of (1) to (6), which picks up an image of an object.

According to the imaging apparatus, it is possible to obtain an excellent image in which the smear is suppressed.

(8) A method of manufacturing the solid state imaging apparatus according to any of (1) to (6), comprising:

forming a gate insulating film in a surface part of a semiconductor substrate in which the photoelectric converting portion is provided;

forming the P-type impurity layer on the gate insulating film; and forming the light shielding film on the P-type impurity layer.

According to the method of manufacturing the solid state imaging apparatus, the P-type impurity layer is formed on the upper surface of the gate insulating film, and the light shielding film is formed on the upper surface of the P-type impurity layer. Therefore, it is possible to bring an equivalent state to a state in which a negative potential is applied between a lower surface of the light shielding film and the semiconductor substrate. Consequently, it is possible to obtain a solid state imaging apparatus in which the height of the potential barrier can be increased and the generation of the smear can be suppressed.

(9) The method of manufacturing the solid state imaging apparatus according to (8), wherein the forming the P-type impurity layer serves to form a semiconductor layer on the gate insulating film and to then implant a P-type impurity ion into the semiconductor layer.

According to the method of manufacturing the solid state imaging apparatus, the semiconductor layer is formed and the P-type impurity ion is implanted into the semiconductor layer. Consequently, it is possible to form the P-type impurity layer.

(10) The method of manufacturing the solid state imaging apparatus according to (9), further comprising carrying out a treatment for activating the P-type impurity layer simultaneously with a reflow treatment for a flattened layer formed on the light shielding film.

According to the method of manufacturing the solid state imaging apparatus, the step of activating the 2-type impurity layer is also used as the heating step of carrying out a reflow treatment over the flattened layer. Thus, the manufacturing process can be simplified.

(11) The method of manufacturing the solid state imaging apparatus according to (9), further comprising carrying out a treatment for activating the P-type impurity layer by a heat treatment using an RTA method.

According to the method of manufacturing the solid state imaging apparatus, it is possible to carry out an activation while suppressing a diffusion of an implanted ion by a high speed heat treatment. In the case in which a shallow junction is to be formed, particularly, the method is effective. It is possible to obtain a high activation rate.

(12) The method of manufacturing the solid state imaging apparatus according to (8), wherein the forming a P-type impurity layer serves to form the P-type impurity layer by CVD.

According to the method of manufacturing the solid state imaging apparatus, the P-type impurity layer is formed by the CVD.

(13) The method of manufacturing the solid state imaging apparatus according to any of (8) to (12), wherein the forming the shielding film on the P-type impurity layer serves to remove an end of the P-type impurity layer by etching and to then form the light shielding film to cover the end of the P-type impurity layer thus exposed.

According to the method of manufacturing the solid state imaging apparatus, the end of the P-type impurity layer can be protected and a shielding property can be enhanced. It is possible to suppress the generation of a smear still more.

BRIEF DESCRIPTION OF THE DRAWINGS

FIGS. 5A and 5B are enlarged sectional views showing a variant in which a nitride film SiN provided under the light shielding film is removed, FIG. 5A illustrating a light shielding film of only W and FIG. 5B illustrating a lamination structure in which Ti/TiN films are additionally provided under the light shielding film of W;

FIGS. 6A and 6B are enlarged sectional views showing a variant in which a nitride film 27b provided under the light shielding film is partially removed, FIG. 6A illustrating an example in which a nitride film is provided under an opening and FIG. 6B illustrating an example in which the nitride film is extended under the light shielding film;

FIGS. 7A and 7B are enlarged sectional views showing a variant in which a P-type Si layer provided under the light shielding film is partially removed, FIG. 7A illustrating a light shielding film of only W and FIG. 7B illustrating a lamination structure in which Ti/TiN films are additionally provided under the light shielding film of W;

FIGS. 8A to 8E are views for explaining a procedure for manufacturing the solid state imaging apparatus according to the invention;

FIGS. 9A to 9E are views for explaining steps according to a variant in which a P-type Si layer is partially removed in the manufacturing procedure illustrated in FIGS. 8A to 8E;

DETAILED DESCRIPTION OF THE INVENTION

A preferred embodiment of a solid state imaging apparatus and an imaging apparatus, and a method of manufacturing the solid state imaging apparatus according to the invention will be described below in detail with reference to the drawings.

Figure 1:
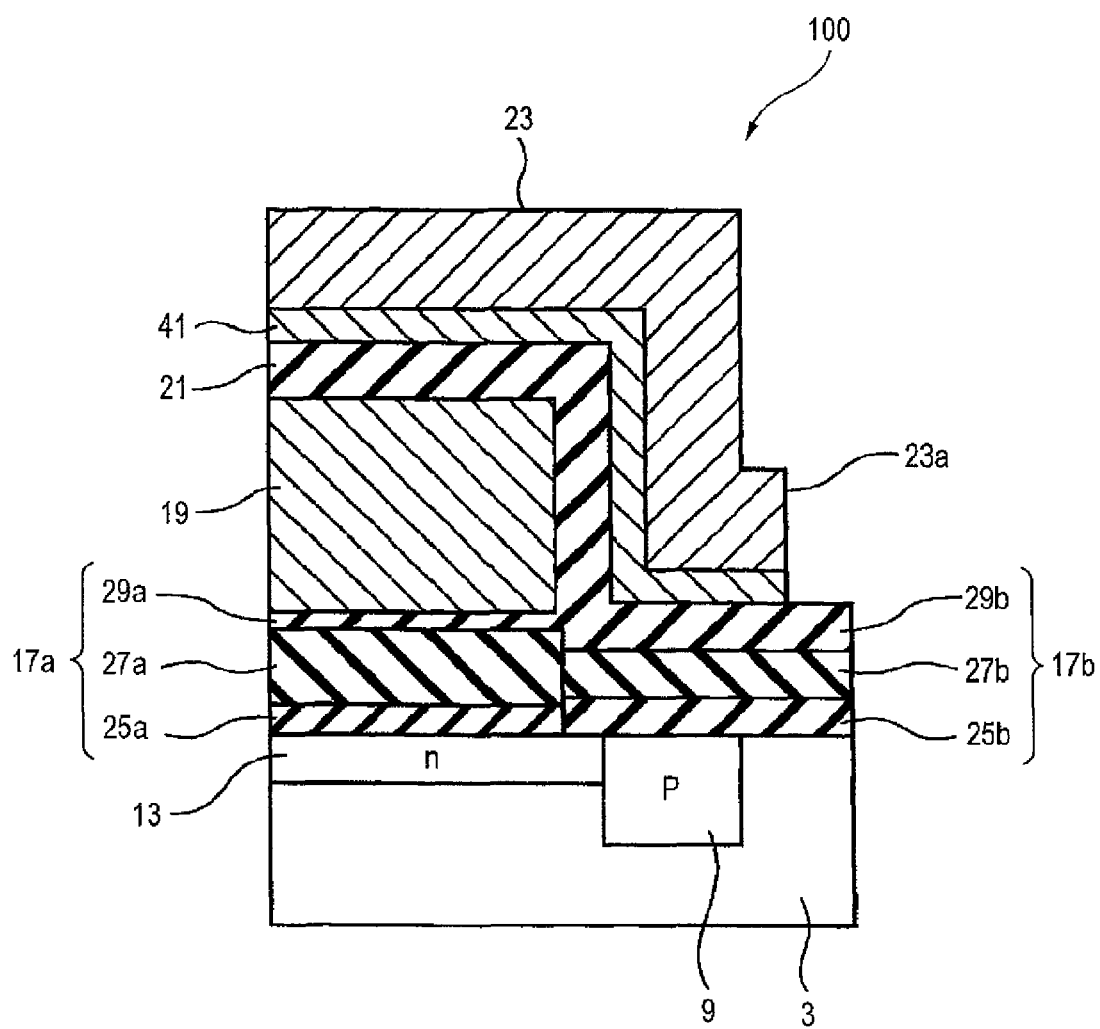
FIG. 1 is an enlarged sectional view showing the vicinity of a device isolating region corresponding to approximately one pixel of a solid state imaging apparatus according to an embodiment of the invention.

FIG. 1 is an enlarged sectional view showing the vicinity of a device isolating region corresponding to approximately one pixel of the solid state imaging apparatus according to the embodiment of the invention. The same members as those shown in FIGS. 11 and 12 have the same reference numerals and description will be thus given.

Figure 11:
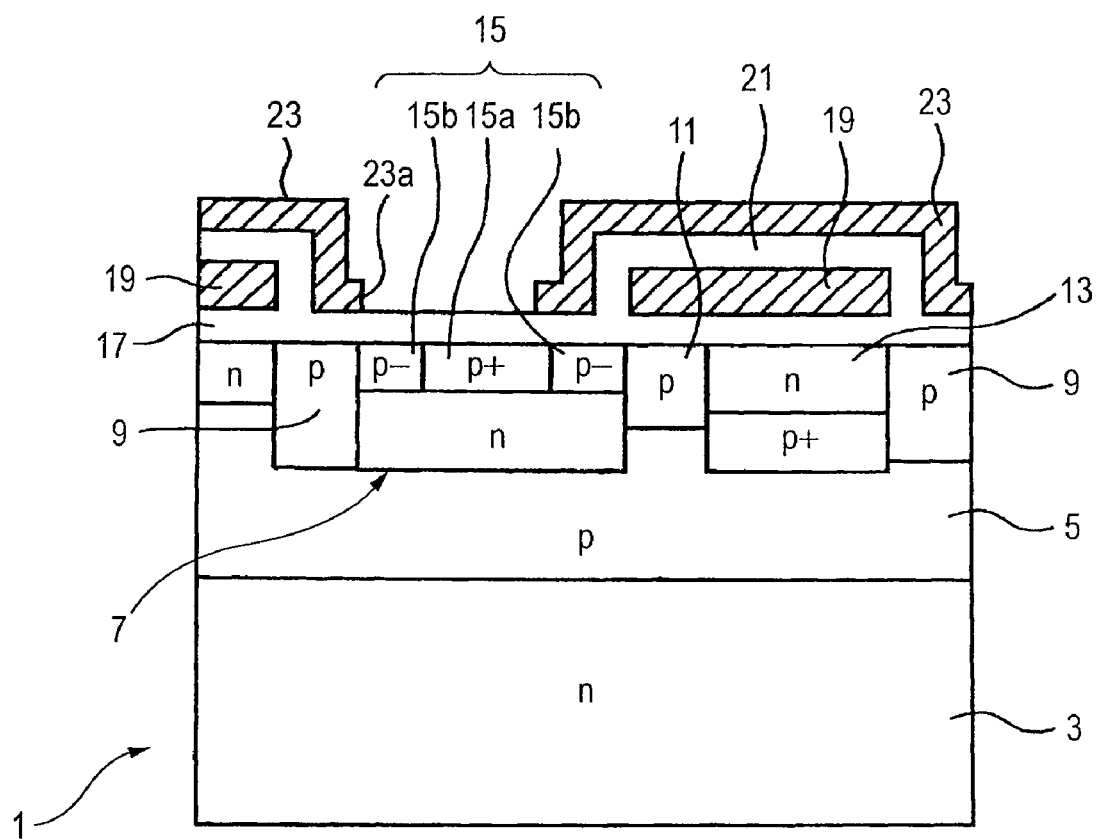
FIG. 11 is a typical view showing a section corresponding to approximately one pixel of the solid state imaging device.
Figure 12A:
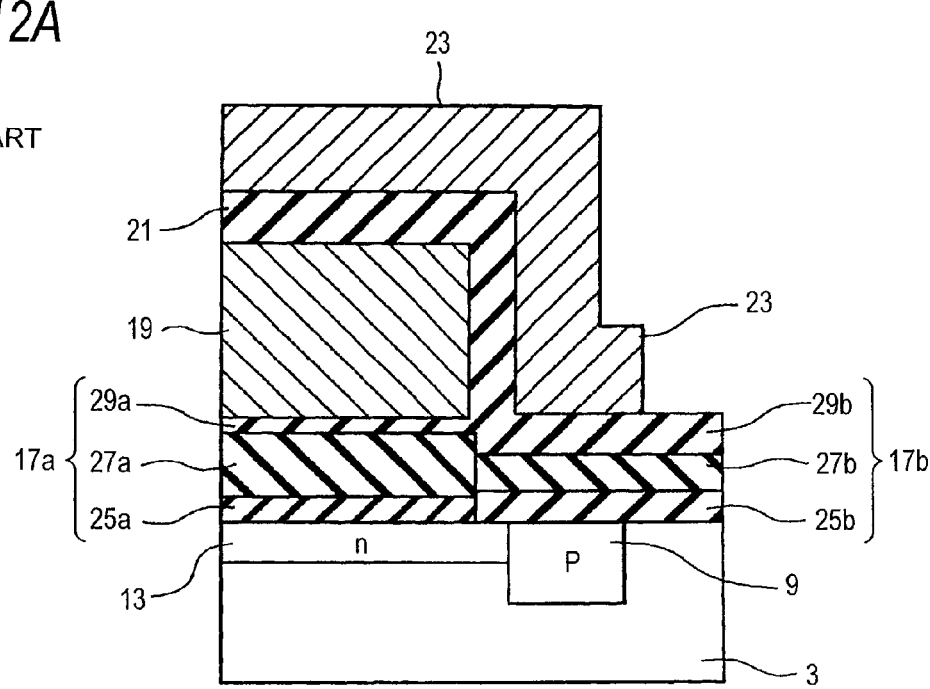
FIGS. 12A and 12B are enlarged sectional views showing the vicinity of a device isolating region in FIG. 11, FIG. 12A illustrating a light shielding film a of only W and FIG. 12B illustrating a lamination structure in which Ti/TiN films are additionally provided under the light shielding film of W.

A solid state imaging apparatus 100 according to the embodiment has almost the same basic structure as that of the solid state imaging device shown in FIG. 11. More specifically, a p-type semiconductor layer 5 (see FIG. 11) is formed on an N-type semiconductor substrate 3 of a solid state imaging device 1, and an N-type region portion (photodiode) 7 (see FIG. 11) for carrying out a photoelectric conversion together with the p-type semiconductor layer 5 is provided in a surface part of the p-type semiconductor layer 5. A device isolating region (p region) 9 is provided on an adjacent pixel side of the N-type region portion 7 and an N region (a charge transfer portion) 13 is provided on an opposite side to the N-type region portion 7 through a reading gate portion 11 (see FIG. 11). The N region 13 constitutes an embedded channel of a vertical transfer path in the solid state imaging device 1.

An uppermost surface of the semiconductor substrate 3 which is provided with the N-type region portion 7 and the embedded channel 13 is covered with an insulating layer 17 (17a, 17b). A vertical transfer electrode film (for example, a polysilicon film) 19 is provided on the insulating layer 17 just above the embedded channel 13. An insulating layer 21 is provided on the vertical transfer electrode film 19.

The insulating layer 17 is constituted by the insulating layer 17a provided under the vertical transfer electrode film 19 and the insulating layer 17b provided under a light shielding film 23, and forms an ONO structure including oxide films (SiO$_2$) 25a and 25b, nitride films (SiN) 27a and 27b, and oxide films (SiO$_2$) 29a and 29b.

More specifically, in the insulating layers 17a and 17b, the oxide film (SiO$_2$) 25a, the oxide film (SiO$_2$) 25b, the nitride film (SiN) 27a, the nitride film (SiN) 27b, the oxide film (SiO$_2$) 29a and the oxide film (SiO$_2$) 29b can be formed in thicknesses of approximately 25 nm, 35 nm, 50 nm, 30 nm, 5 nm and 50 nm, respectively.

Figure 12B:
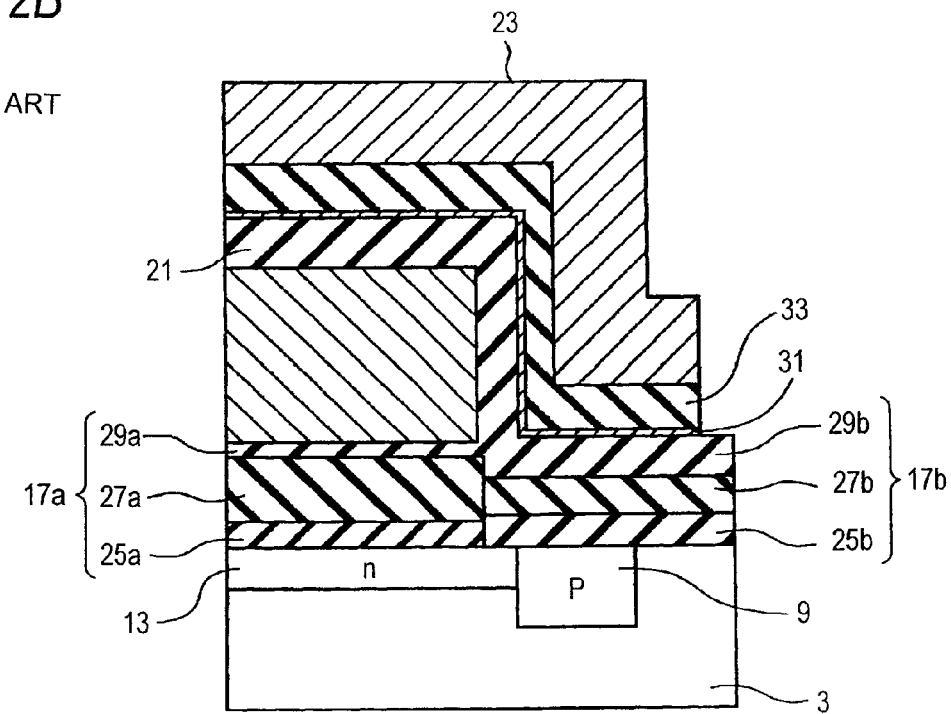

As shown in FIG. 12B, moreover, titanium (Ti) 31 and a titanium nitride film (TiN) 33 may be provided between the light shielding film 23 and the oxide film 29. The Ti/TiN films produce the functions and advantages for preventing the light shielding film 23 from being peeled.

In the solid state imaging apparatus 100 according to the embodiment, a P-type impurity layer 41 is formed between a lower surface of the light shielding film 23 covering the charge transfer electrode 19 and the silicon substrate 3. In other words, the light shielding film 23 formed by a W film is provided through the P-type impurity layer 41. An opening 23a is provided on the light shielding film 23 just above each photodiode 7, and a light is incident into the N-type region portion 7 via the opening 23a.

In the solid state imaging apparatus 100, an end of the opening 23a of the light shielding film 23 is extended to a position in which a low concentration portion 15b of a high concentration impurity surface layer 15 is covered. A flattened layer (not shown) is provided on the light shielding film 23, a color filter layer (not shown) is provided on a surface of the flattened layer having the surface flattened, and a microlens is provided thereon.

In the solid state imaging apparatus 100 having the structure, when a light is irradiated on a light receiving surface and is incident on the photodiode 7, a signal charge (an electron in the example) corresponding to each incident light quantity is stored in the photodiode 7. When a reading pulse is output from external imaging device driving means to the solid state imaging apparatus 100, the reading pulse is applied to the vertical transfer electrode 19 which also serves as a reading electrode. Consequently, the charge (signal charge) stored in the photodiode 7 is read onto the embedded channel 13 through the reading gate portion 11.

When a vertical transfer pulse and a horizontal transfer pulse are output from the external imaging device driving means to the solid state imaging apparatus 100, then, each signal charge on the vertical charge transfer path 13 is transferred over the vertical charge transfer path, and furthermore, is transferred over the horizontal charge transfer path so that an output signal corresponding to an amount of the signal charges is read by an amplifier.

In order to change a portion provided under the light shielding film 23 into a P-type impurity layer, it is possible to take a structure in which P-type Si is inserted under W or a structure in which the P-type Si is inserted under W/TiN/Ti as shown in FIG. 1.

Figure 2:
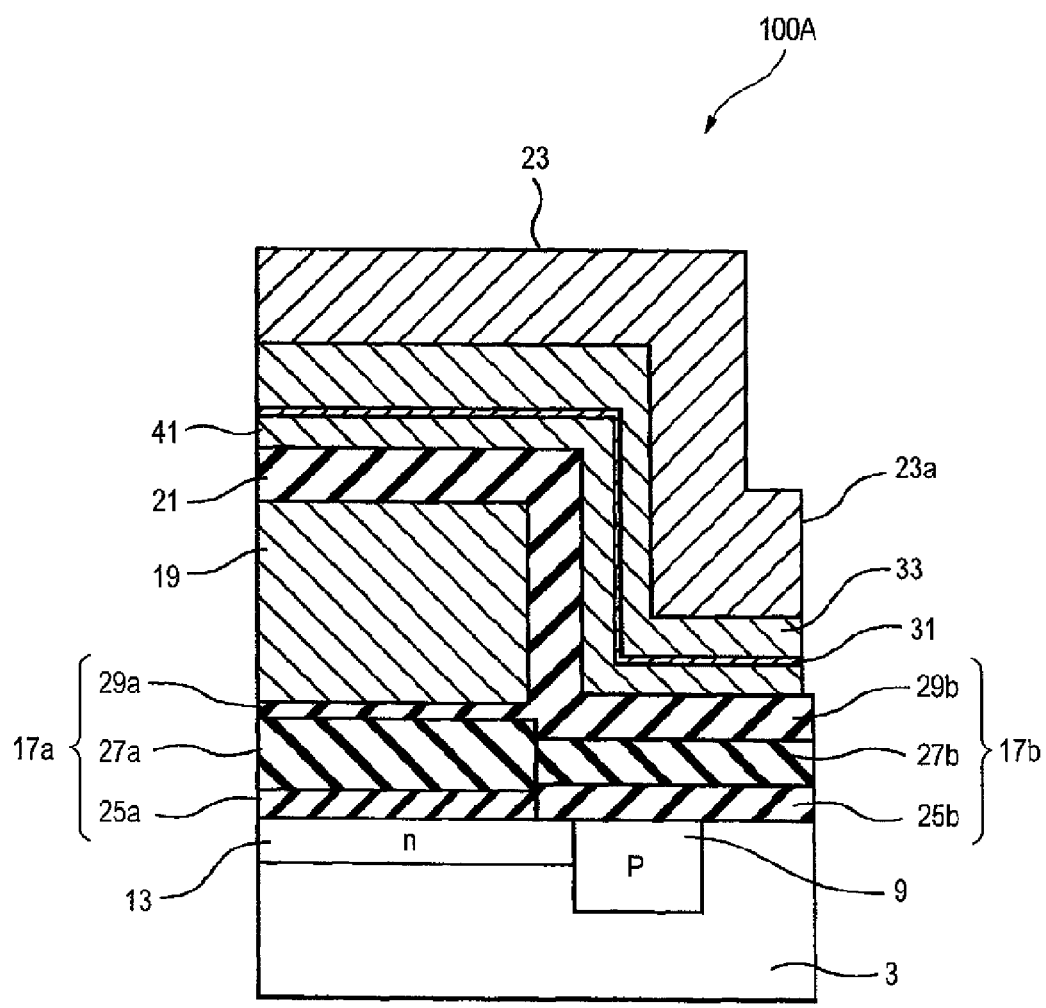
FIG. 2 is an enlarged sectional view showing a variant in which Ti/TiN films are additionally provided under a light shielding film of the solid state imaging apparatus illustrated in FIG. 1.

FIG. 2 is an enlarged sectional view showing a variant in which Ti/TiN films are additionally provided under the light shielding film 23 of the solid state imaging apparatus illustrated in FIG. 1.

In the structure shown in FIG. 1, the P-type Si is formed in place of the Ti/TiN films as shown in FIG. 12B. In a structure shown in FIG. 2, the P-type Si is inserted under the Ti/TiN films. With the structure, the past structure is exactly maintained and the P-type Si is provided between the Ti/TiN films and an insulating film. Consequently, it is possible to control a smear current depending on a difference in a work function which will be described below. Moreover, the structure provided under W is exactly maintained. Therefore, the light shielding film 23 can be formed by the same technique as the past technique in a manufacture. Although the structure shown in FIG. 1 is simple, the Ti/TiN films are originally provided in order to prevent the light shielding film from being peeled. For this reason, it can also be supposed that a simple replacement cannot be carried out. In that case, it is also possible to insert the P-type Si under the Ti/TiN films as shown in FIG. 2.

Figure 3:
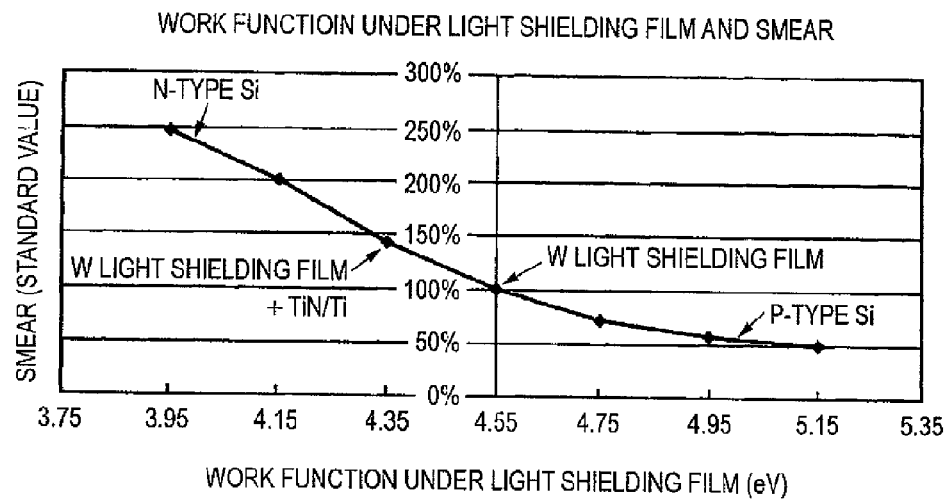
FIG. 3 is a correlation chart representing an amount of a smear generated corresponding to a work function of a material provided under the light shielding film based on the case in which the light shielding film is formed by only a tungsten film.

FIG. 3 is a correlation chart representing an amount of a smear generated corresponding to a work function of a material provided under a light shielding film on the basis of the case in which the light shielding film is formed by only a tungsten film.

A smear current is a component getting out of a device isolating region/reading gate region and flowing into a transfer path in a close part to an Si surface. By reducing potentials of the device isolating region 9 and the reading gate region 9 to be lower than the actual ones (toward a negative side) in order to lessen the smear current, it is possible to improve a smear. In order to implement the improvement, it is preferable to insert the P-type Si under the W or TiN/Ti films provided on the device isolating region 9 and the reading gate region. FIG. 3 shows a result obtained by a simulation taking N-type Si as an example. It is apparent from FIG. 3 that the smear is reduced when a value of the work function is increased. The increase in the value of the work function implies an equivalence to an application of a negative potential.

By inserting the P-type Si under the light shielding film 23 to be W/TiN/Ti, it is possible to easily apply the negative potential to the lower part of the light shielding film 23. More specifically, a work function of the P-type Si is approximately 4.95 eV and can be greater by approximately 0.6 eV than that in Ti to be a lowermost part in a W/TiN/Ti structure used generally (a work function of 4.33 eV) or approximately 0.4 eV than that in W used usually (a work function of 4.55 eV). The increase in the work function implies an equivalence to the application of the negative potential as compared with the case of a small work function. Consequently, it is possible to expect the effect of improving the smear. In other words, it is possible to suppress the smear current depending on the difference in the work function.

Figure 4:
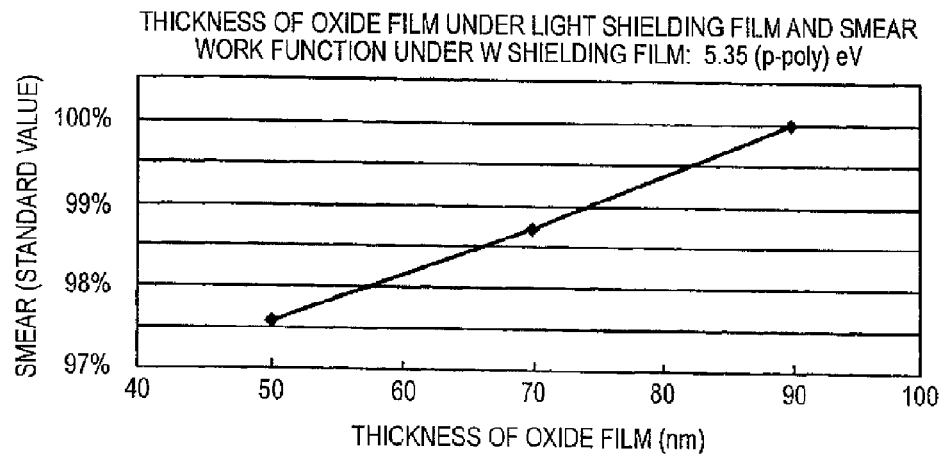
FIG. 4 is a correlation chart representing a thickness of an oxide film provided under the light shielding film and the amount of the smear.

FIG. 4 is a correlation chart representing a thickness of an oxide film provided under a light shielding film and an amount of a smear.

It is preferable that a thickness of the insulating film provided under the P-type Si should be reduced as greatly as possible in order to work well as an electrode. However, the reduction in the thickness of the insulating film in this part has a limitation in respect of dielectric voltages of the electrode 19 and the light shielding film 23. Under the circumstances, an electrode potential (VH) and a potential (GND) of the light shielding film are 15V at a maximum. In case of a breakdown voltage in a B mode (3 MV/cm), therefore, a thickness of approximately $15/(3 \times 10^6) = 5 \times 10^{-6}$ (cm)=50 nm is required at a minimum. At this time, if VH is reduced to be approximately 12 V by a characteristic improvement, the thickness can be reduced to be $12 (3 \times 10^6)$=40 nm. In the case in which a W bias is added, furthermore, a potential difference between the electrode 19 and the light shielding film 23 can be reduced (for example, when the potential of the light shielding film is set to be −8V, a potential difference of approximately 15−8=7V is obtained). In that case, there is a possibility that the film thickness can be set to be approximately $7/(3 \times 10^6)$=23 nm.

FIGS. 5A and 5B are enlarged sectional views showing a variant in which the nitride film SiN provided under the light shielding film is removed, FIG. 5A showing a light shielding film of only W and FIG. 5B showing a lamination structure in which Ti/TiN films are additionally provided under the light shielding film of W.

In solid state imaging apparatuses 200 and 200A according to the variant, the thickness of the insulating film 17b is reduced excluding the nitride film (SiN) 27b provided under the light shielding film 23. More specifically, the thickness of the insulating film 17b provided under the P-type Si is reduced as greatly as possible within a range of a dielectric voltage in order to further extract the effect of suppressing the smear. By reducing the thickness of the film, consequently, it is possible to increase a height of a potential barrier more greatly. A range in which the nitride film 27b provided under the light shielding film 23 is left is not particularly restricted. Based on the thinking way of the suppression of the smear, it is more preferable that the insulating film 17b provided under the light shielding film 23 should have a smaller thickness. In the case in which there is a restriction in respect of a manufacture, the nitride film 27b may be left in the device isolating region 9. Moreover, an amount of the nitride film 27b to be left is not restricted. Therefore, it is possible to leave the nitride film 27b within a range in which there is no problem in respect of the manufacture.

FIGS. 5A and 5B show an example in which the nitride film 27b is perfectly removed from the device isolating region 9 in order to improve the smear. In the case in which the method has a restriction in respect of the manufacture, there is no problem even if the nitride film 27h is left in the device isolating region 9 to some degree. FIGS. 6A and 6B show the variant.

FIGS. 6A and 6B are enlarged sectional views showing a variant in which the nitride film 27b provided under the light shielding film is partially removed, FIG. 6G showing an example in which a nitride film is provided under an opening and FIG. 6B showing an example in which the nitride film is extended under the light shielding film.

In solid state imaging apparatuses 300 and 300A according to the variant, the nitride film 27b is shifted from a part provided under the light shielding film 23 as shown in FIG. 6A. Consequently, the thickness of the insulating film 17b provided under the light shielding film 23 can be reduced and the height of the potential barrier can be increased more greatly. In a structure shown in FIG. 6B, moreover, the light shielding film 23 and the P-type impurity layer 41 are formed like an upward step. Consequently, it is possible to extend the nitride film 27b under the light shielding film 23 while forming the insulating layer 17b to be thin. With the structures, the height of the potential barrier can be increased, and furthermore, the light incident from the opening 23a can be intercepted by the nitride film 27b. As compared with the structure in which the nitride film 27b is perfectly removed as shown in FIGS. 5A and 53, it is possible to lessen the smear more greatly.

FIGS. 7A and 7B are enlarged sectional views showing a variant in which the P-type Si layer provided under the light shielding film is partially removed, FIG. 7A showing a light shielding film of only W and FIG. 7B showing a lamination structure in which Ti/TiN films are additionally provided under the light shielding film of W.

Solid state imaging apparatuses 400 and 400A according to the variant have such a structure that the P-type impurity layer 41 provided under the light shielding film 23 is perfectly covered with the light shielding film 23. Si transmits a light therethrough and is disadvantageous to take a countermeasure against the smear. In portions other than a region in which a negative bias is to be applied, therefore, it is preferable to employ a lamination structure in which an end of the P-type impurity layer 41 is not exposed as shown in FIGS. 7A and 7B in place of a lamination structure of only the light shielding film 23/P-type impurity layer 41 in which the end of the P-type impurity layer 41 is exposed at the opening 23a. In this case, the P-type impurity layer 41 is subjected to patterning and is then covered perfectly with the light shielding film 23, and is thus formed.

The vicinity of the device isolating region 9 has been particularly described above in detail. According to the invention, however, the same advantages can be produced by the reading gate portion 11 other than the device isolating region 9 or the P-type impurity layer provided between the light shielding film 23 and the silicon substrate 3.

Next, description will be given to an example of the manufacture of the solid state imaging apparatus 100 having the structure.

FIGS. 8A to 8E are views for explaining a procedure for manufacturing the solid state imaging apparatus according to the invention.

First of all, as shown in FIG. 8A, silicon oxide films 25a and 25b, silicon nitride films 27a and 27b, and silicon oxide films 29a and 29b are formed on a surface of an n-type silicon substrate 3, and insulating layers (gate oxide films) 17a and 17b having a three-layer structure are thus formed.

Subsequently, a vertical transfer electrode film 19 and an insulating layer 21 are formed on the insulating layers 17a and 17b, and a polycrystalline silicon film 41 to be a first layer is formed on the insulating layer 21 as shown in FIG. 8B. As shown in FIG. 8C, then, the polycrystalline silicon film 41 is doped by an ion implantation to form a P-type impurity layer 41. W to be a light shielding film 23 is formed on the P-type impurity layer 41. As shown in FIG. 3D, thereafter, a resist pattern 43 is formed by photolithography. As shown in FIG. 8E, subsequently, an opening 23a is formed in a photodiode forming region to be a photoelectric converting portion by etching.

Although a heat treatment for a boron activation after a $B^+$ implantation has not been particularly described in the example of the manufacture, the activating step may be carried out in any timing. As an example, the heat treatment is executed as a BPSG reflow treatment (850° C.) and special RTA (Rapid Thermal Annealing) is added for the activation.

While the transfer electrode has not been described in a serial flow, moreover, it is desirable that a transfer electrode usually using N-type poly-Si should also be changed into P-type poly-Si. The reason is a countermeasure to be taken against the smear. It is possible to expect an improvement in the smear by changing the transfer electrode into the P-type poly-Si in the same manner as the insertion of the P-type poly-Si under the light shielding film.

Next, description will be given to an example of the manufacture of the solid state imaging apparatus 400 having the structure.

FIGS. 9A to 9E are views for explaining steps according to a variant in which a P-type Si layer is partially removed in the manufacturing procedure shown in FIGS. 8A to 8E.

Referring to the solid state imaging apparatus 400, the manufacturing steps shown in FIGS. 9A to 9C are the same as those in the solid state imaging apparatus 100. Accordingly, description will be omitted. After a P-type impurity layer 41 is formed, an end on an opening 23a side of the P-type impurity layer 41 is removed by etching with a resist pattern set to be a mask as shown in FIG. 9D. Next, W to be a light shielding film 23 is formed on the P-type impurity layer 41 from which the end is removed, and an opening 23a shown in FIG. 9E is then formed in a photodiode forming region to be a photoelectric converting portion by the etching with the resist pattern set to be the mask. Consequently, there is obtained the solid state imaging apparatus 400 in which the P-type impurity layer 41 is perfectly covered with the light shielding film 23.

Description will be given to a digital camera comprising the solid state imaging apparatus according to the embodiment.

Figure 10:
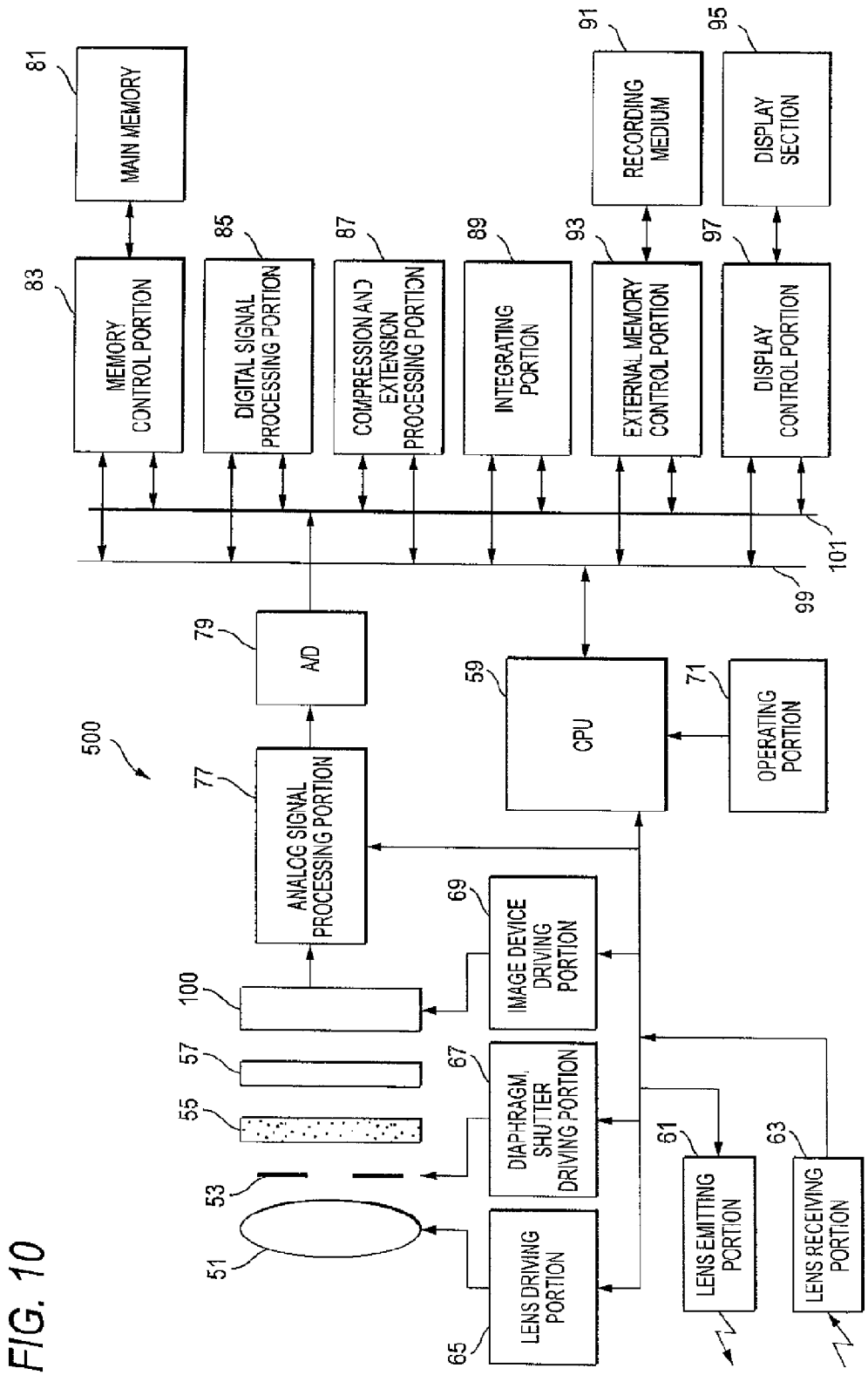
FIG. 10 is a block diagram showing a digital camera loading the solid state imaging apparatus (the solid state imaging device)

FIG. 10 is a block diagram showing a digital camera loading the solid state imaging apparatus (the solid state imaging device) according to the invention.

A digital camera (an imaging apparatus) 500 which is shown comprises a photographing lens 51, a solid state imaging device 100, a diaphragm 53 provided between both of them, an infrared cut filter 55, and an optical low-pass filter 57. A CPU 59 for generalizing and controlling the whole digital camera controls a flash light emitting portion 61 and a light receiving portion 63, and controls a lens driving portion 65 to adjust a position of the photographing lens 51 to a focusing position and controls an opening amount of the diaphragm 53 through a diaphragm driving portion 67, thereby regulating an amount of exposure.

Moreover, the CPU 59 drives the solid state imaging device 100 through an imaging device driving portion 69 and outputs, as a color signal, an image of an object which is picked up by the photographing lens 51. An instruction signal is input from a user to the CPU 59 via an operating portion 71, and the CPU 59 carries out various control operations in accordance with the instruction.

An electrical control system of the digital camera 500 includes an analog signal processing portion 77 connected to an output of the solid state imaging device 100 and an A/D converting circuit 79 for converting, into digital signals, color signals of R, G and B which are output from the analog signal processing portion 77. They are controlled by the CPU 59.

Furthermore, the electrical control system of the digital camera 500 includes a memory control portion 83 connected to a main memory (a frame memory) 81, a digital signal processing portion 85 for carrying out an image processing such as a gamma correcting calculation, an RGB/YC conversion processing or an image synthesis processing, a compression and expansion processing portion 87 for compressing a pickup image into a JPEG image and expanding the compressed image, an integrating portion 89 for integrating photometric data and obtaining a gain of a white balance correction which is to be carried out by the digital signal processing portion 85, an external memory control portion 93 to which a removable recording medium 91 is connected, and a display control portion 97 to which a liquid crystal display position 95 loaded onto a back face of the camera is connected. They are mutually connected through a control bus 99 and a data bus 101, and are controlled in accordance with a command given from the CPU 59.

In the case in which an image of an object is to be picked up by the digital camera 500 according to the embodiment, each pixel 23 shown in FIG. 11 stores a signal charge corresponding to an amount of a received light while suppressing the influence of a smear, the signal charge is first read and transferred to the vertical charge transfer path 13, and furthermore, the signal charge sent to a horizontal charge transfer path (not shown) is transferred and is then sent as an output signal from an output portion (not shown).

The CPU 59 reads an output signal corresponding to an amount of a received light of each pixel from the solid state imaging device 100 and the digital signal processing portion 85 generates image data of an object in cooperation with each portion.

According to the digital camera 500 having the structure, it is possible to suppress the generation of a smear, thereby obtaining an excellent image.

According to the solid state imaging apparatus in accordance with the invention, the P-type impurity layer is formed between the lower surface of the light shielding film covering the charge transfer portion and the semiconductor substrate. By providing the P-type impurity layer, consequently, it is possible to bring an equivalent state to a state in which a negative potential is applied, thereby increasing the height of the potential barrier. Therefore, an electron generated on the surface of the light receiving portion can be prevented from flowing into the charge transfer path through the potential barrier, and the generation of a smear can be suppressed.

According to the method of manufacturing the solid state imaging apparatus in accordance with the invention, the semiconductor layer is formed on the upper surface of the gate insulating film provided on the semiconductor substrate, the semiconductor layer is changed into the P-type impurity layer by the ion implantation, and the P-type impurity layer is then activated by the heat treatment or the P-type layer is formed by the CVD. Therefore, it is possible to obtain an equivalent solid state imaging apparatus to an apparatus in which a negative potential is applied between a lower surface of a light shielding film covering a charge transfer portion and a semiconductor substrate.

As described above, according to the solid state imaging apparatus and the imaging apparatus, and the method of manufacturing the solid state imaging apparatus in accordance with the invention, the P-type impurity layer is formed between the lower surface of the light shielding film covering the charge transfer portion and the semiconductor substrate. Therefore, there is brought an equivalent state to a state in which a negative potential is applied between the lower surface of the light shielding film and the semiconductor substrate, and the height of the potential barrier can be increased. Therefore, the electron generated on the surface of the light receiving portion can be prevented from flowing into the charge transfer path by the potential barrier so that the generation of the smear can be suppressed. Accordingly, it is possible to suppress the generation of the smear well by applying the invention to a CCD image sensor such as an imaging apparatus.

The entire disclosure of each and every foreign patent application from which the benefit of foreign priority has been claimed in the present application is incorporated herein by reference, as if fully set forth.

What is claimed is:

1. A method of manufacturing a solid state imaging apparatus comprising
    a semiconductor substrate;
    a photoelectric converting portion on the semiconductor substrate;
    a light shielding film in a region excluding a light receiving surface of the photoelectric converting portion; and
    a P-type impurity layer between a lower surface of the light shielding film and the semiconductor substrate,
    the method comprising:
    forming a gate insulating film in a surface part of a semiconductor substrate in which the photoelectric converting portion is provided;
    forming the P-type impurity layer on the gate insulating film; and
    forming the light shielding film on the P-type impurity layer.

2. The method of manufacturing the solid state imaging apparatus according to claim 1,
    wherein the forming the P-type impurity layer serves to form a semiconductor layer on the gate insulating film and to then implant a P-type impurity ion into the semiconductor layer.

3. The method of manufacturing the solid state imaging apparatus according to claim 2, further comprising
    carrying out a treatment for activating the P-type impurity layer simultaneously with a reflow treatment for a flattened layer formed on the light shielding film.

4. The method of manufacturing the solid state imaging apparatus according to claim 2, further comprising
    carrying out a treatment for activating the P-type impurity layer by a heat treatment using an RTA method.

5. The method of manufacturing the solid state imaging apparatus according to claim 1,
    wherein the forming a P-type impurity layer serves to form the P-type impurity layer by CVD.

6. The method of manufacturing the solid state imaging apparatus according to claim 1,
    wherein the forming the shielding film on the P-type impurity layer serves to remove an end of the P-type impurity layer by etching and to then form the light shielding film to cover the end of the P-type impurity layer thus exposed.

* * * * *